(12) United States Patent
Wang et al.

(10) Patent No.: US 7,205,642 B2
(45) Date of Patent: Apr. 17, 2007

(54) SEMICONDUCTOR PACKAGE AND METHOD FOR FABRICATING THE SAME

(75) Inventors: Yu-Po Wang, Taichung Hsien (TW); Chien-Ping Huang, Hsinchu Hsein (TW); Cheng-Hsu Hsiao, Nantou (TW)

(73) Assignee: Siliconware Precision Industries Co., Ltd. (TW)

( * ) Notice: Subject to any disclaimer, the term of this patent is extended or adjusted under 35 U.S.C. 154(b) by 95 days.

(21) Appl. No.: 10/972,200

(22) Filed: Oct. 22, 2004

(65) Prior Publication Data

US 2005/0253284 A1 Nov. 17, 2005

(30) Foreign Application Priority Data

May 12, 2004 (TW) .............................. 93113297 A (51) Int. Cl.
*H01L 23/495* (2006.01)

(52) U.S. Cl. ...................................... 257/666; 257/668

(58) Field of Classification Search ............... 257/668, 257/666; 438/123

See application file for complete search history.

(56) References Cited

U.S. PATENT DOCUMENTS 6,218,731 B1 * 4/2001 Huang et al. ................ 257/738
6,521,980 B1 * 2/2003 Tandy et al. ................. 257/668

* cited by examiner

*Primary Examiner*—Theresa T. Doan
(74) *Attorney, Agent, or Firm*—Peter F. Corless; Steven M. Jensen; Edwards Angell Palmer & Dodge LLP (57) ABSTRACT

A semiconductor package and a method for fabricating the same are proposed. A substrate having a first circuit layer, a second circuit layer, and a core layer formed between the first and second circuit layers is provided. At least one second opening is formed on the second circuit layer. At least one first opening is formed on the first circuit layer corresponding to the second opening. A plurality of finger holes corresponding to bond fingers on the first circuit layer are formed in the core layer. A through opening is formed in the core layer and communicates with the first and second openings. At least one chip is mounted on the first circuit layer and covers the first opening, with its active surface being exposed to the first opening. An encapsulant is formed to fill the first and second openings and the through opening and encapsulate the chip.

7 Claims, 7 Drawing Sheets

SEMICONDUCTOR PACKAGE AND METHOD FOR FABRICATING THE SAME

FIELD OF THE INVENTION

The present invention relates to semiconductor packages and fabrication methods thereof, and more particularly, to a window ball grid array (WBGA) semiconductor package with an improved yield, and a method for fabricating the semiconductor package.

BACKGROUND OF THE INVENTION

A window ball grid array (WBGA) semiconductor package employs an advanced type of BGA packaging technology, wherein at least one opening is formed through a substrate, and a semiconductor chip is mounted on the substrate in an upside-down manner that an active surface of the chip faces downwards and covers the opening of the substrate, allowing the chip to be electrically connected to a lower surface of the substrate via a plurality of gold wires received in the opening. Such package structure can effectively reduce the length of gold wires and improve the quality of electrical communication between the chip and substrate, which thus has been widely applied to DRAM (dynamic random access memory) chips having central pads.

Figure 1:
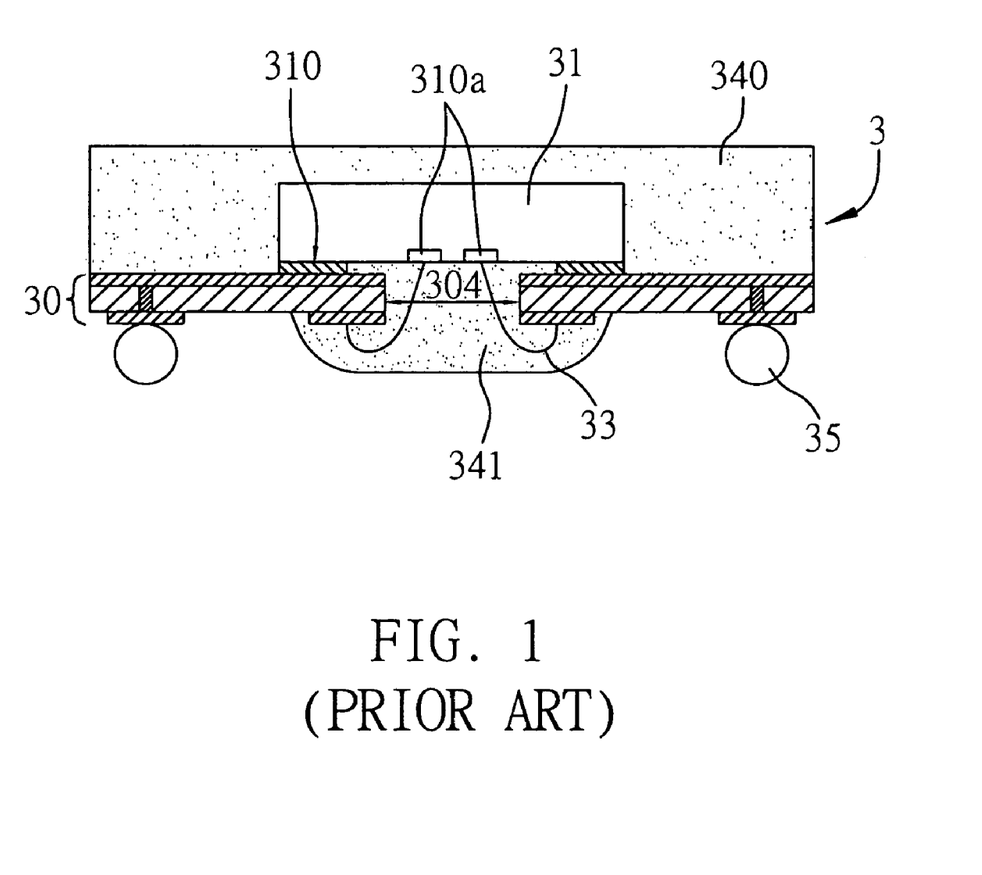
FIG. 1 (PRIOR ART) is a schematic cross-sectional view of a WBGA semiconductor package disclosed by U.S. Pat. No. 6,218,731.

U.S. Pat. No. 6,218,731 discloses a WBGA semiconductor package. As shown in FIG. 1, this semiconductor package 3 comprises a substrate 30 having a central opening 304 therethrough; a chip 31 mounted on the substrate 30, with bond pads 310a on an active surface 310 of the chip 31 being exposed to the opening 304 of the substrate 30; a plurality of gold wires 33 received in the opening 304, for electrically connecting the bond pad 310a of the chip 31 to a lower surface of the substrate 30; a first encapsulant 340 and a second encapsulant 341 formed on an upper surface and the lower surface of the substrate 30 respectively, for encapsulating the chip 31 and filling the opening 304; a plurality of solder balls 35 implanted on the lower surface of the substrate 30 not having the second encapsulant 341, for establishing electrical connection with external electronic devices.

Figure 2:
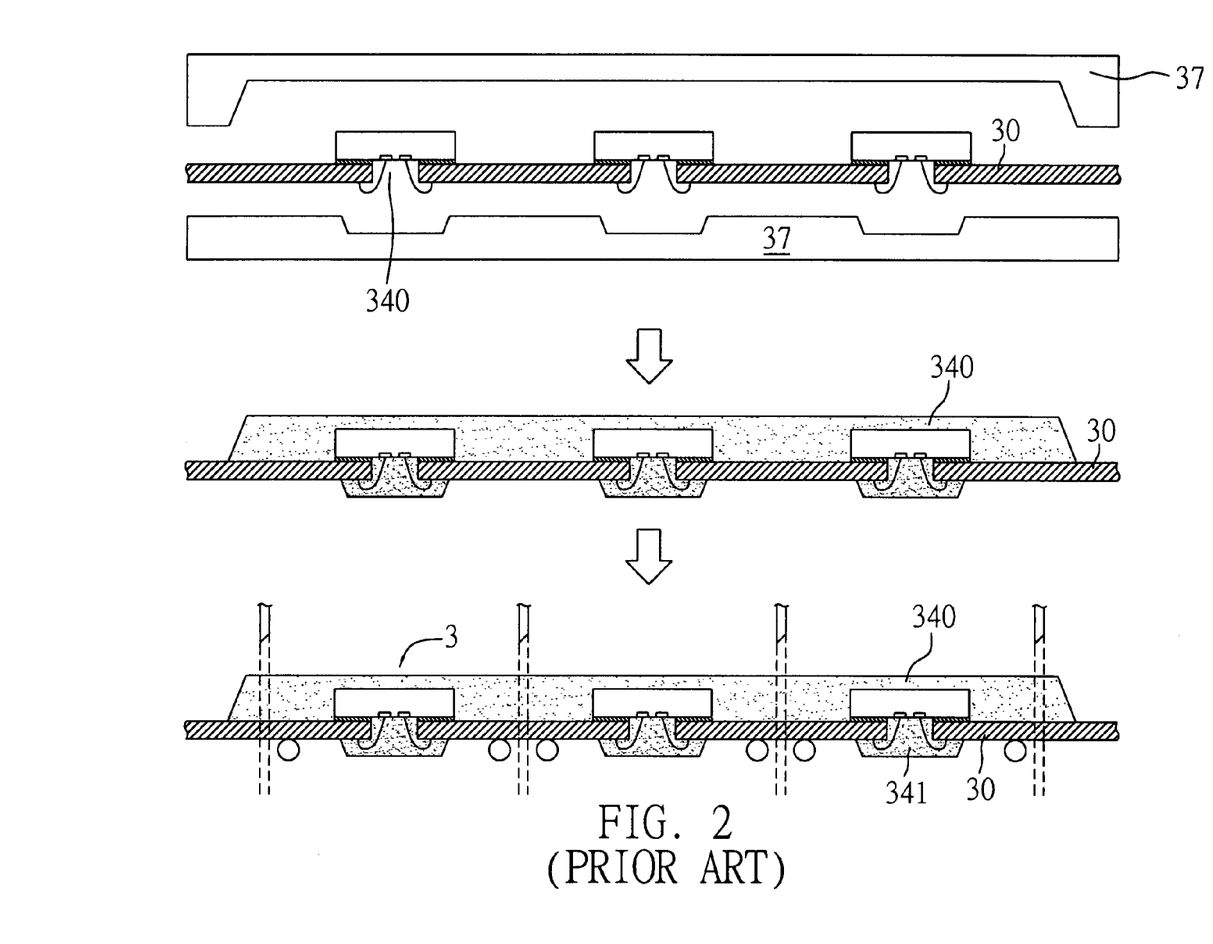
FIG. 2 (PRIOR ART) is a flow chart showing a molding process and a sawing process for fabricating conventional WBGA semiconductor packages.

Conventionally due to cost concerns for fabricating the above semiconductor package, a molding process is performed in a batch manner to encapsulate a substrate strip comprising a plurality of substrates, and then a sawing process is carried out to separate apart the individual substrates. As shown in FIG. 2, after the chip-mounting and wire-bonding processes, the substrate strip 30 (designated with the same reference numeral as substrate) is placed between an upper mold and a lower mold of a transfer mold 37. After engaging the upper and lower molds, injecting a molding compound and performing a curing step, which are known in the art, the first encapsulant 340 and the second encapsulant 341 are respectively formed on the upper surface and the lower surface of the substrate 30. Finally, after the ball-implanting process, the package structure is sawed to form a plurality of individual WBGA semiconductor packages 3.

Such molding method is relatively cost-effective and suitable for mass production. However, since loops of the gold wires and the second encapsulant for encapsulating the gold wires protrude from the lower surface of the substrate, in order to fabricate appropriate second encapsulants, it needs to prepare different types of molds corresponding to different sizes and structures of openings in the substrates, which would undesirably increase the fabrication cost. Moreover, in order to completely encapsulate the gold wires, the second encapsulant may occupy relatively much area on the substrate, thereby limiting the density and number of solder balls that can be implanted on the substrate. In addition, since the first encapsulant and the second encapsulant are not completely symmetric to each other, the upper and lower molds may not firmly clamp the substrate, thereby leading to flash of the second encapsulant on the lower surface of the substrate. This not only affects the appearance of the package but also may cover ball pads on lower surface of the substrate, which would adversely affect the ball-implanting process and degrade the electrical performance of the solder balls formed on the ball pads. As a result, an extra step of using a solvent to remove the encapsulant flash is required. The flash problem is thus considered as a significant drawback in the prior art.

Therefore, the problem to be solved here is to provide a semiconductor package and a method for fabricating the same, which can increase the density of implanted solder balls and solve the flash problem, so as to improve the overall yield and electrical performance.

SUMMARY OF THE INVENTION

Accordingly, a primary objective of the present invention is to provide a semiconductor package and a method for fabricating the same, without having an encapsulant protruding out of a substrate in the semiconductor package.

Another objective of the present invention is to provide a semiconductor package and a method for fabricating the same, which can increase the density of implanted solder balls on a substrate in the semiconductor package.

Still another objective of the present invention is to provide a semiconductor package and a method for fabricating the same, without the occurrence of flash of an encapsulant.

A further objective of the present invention is to provide a semiconductor package and a method for fabricating the same, which only require the use of simple molds.

A further objective of the invention is to provide a semiconductor package and a method for fabricating the same, which can enhance the mechanical strength and supportability of bonding wires in the semiconductor package.

Another objective of the invention is to provide a semiconductor package and a method for fabricating the same, which can improve the yield of the bonding wires and the electrical performance of the semiconductor package.

In order to achieve the foregoing and other objectives, the present invention proposes a method for fabricating a semiconductor package, comprising the steps of: preparing a substrate having a first circuit layer, a second circuit layer, and a core layer formed between the first circuit layer and the second circuit layer; forming at least one second opening on the second circuit layer, and forming at least one first opening on the first circuit layer at a position corresponding to the second opening; forming a plurality of finger holes in the core layer at positions corresponding to a plurality of bond fingers formed on the first circuit layer; forming a through opening in the core layer, allowing the through opening to communicate with the first opening of the first circuit layer and the second opening of the second circuit layer; mounting at least one chip on the first circuit layer of the substrate, allowing the chip to cover the first opening and allowing an active surface of the chip to be exposed to the first opening; forming a plurality of bonding wires to electrically connect the active surface of the chip to the plurality of bond fingers on the first circuit layer through the finger holes; forming an encapsulant on the substrate to fill the first and second openings and the through opening and encapsulate the chip and the bonding wires; and implanting a plurality of solder balls on the substrate.

A semiconductor package fabricated by the above method according to the present invention comprises: a substrate having a first circuit layer, a second circuit layer, and a core layer formed between the first circuit layer and the second circuit layer, wherein at least one second opening is formed on the second circuit layer and at least one first opening is formed on the first circuit layer at a position corresponding to the second opening, and wherein a plurality of finger holes are formed in the core layer at positions corresponding to a plurality of bond fingers formed on the first circuit layer, and a through opening is formed in the core layer and communicates with the first and second openings; at least one chip mounted on the first circuit layer of the substrate to cover the first opening, allowing an active surface of the chip to be exposed to the first opening; a plurality of bonding wires for electrically connecting the active surface of the chip to the plurality of bond fingers on the first circuit layer through the finger holes; an encapsulant for filling the first and second openings and the through opening and encapsulating the chip and the bonding wires; and a plurality of solder balls implanted on the substrate.

The above finger holes in the core layer are formed by laser drilling. By a material selectivity characteristic of laser, the laser drilling technique can avoid damage to the bond fingers on the first circuit layer. The through opening in the core layer is formed by using a router. And the first opening of the first circuit layer and the second opening of the second circuit layer are formed by a conventional etching technique.

In addition, the core layer is further formed with a plurality of conductive vias for electrically connecting the first and second circuit layers to each other. A nickel(Ni)/gold(Au) layer is plated on the bond fingers respectively so as to enhance the bonding reliability between the bonding wires and the bond fingers.

Accordingly, by provision of the first and second openings of the first and second circuit layers respectively and the plurality of finger holes in the core layer in the present invention, the bonding wires are completely received in the through opening of the substrate, such that the encapsulant for encapsulating the bonding wires does not protrude out of the substrate. This allows the density of solder balls implanted on the substrate to be increased, and eliminates the drawbacks of encapsulant flash and difficulty in standardizing the mold used for fabricating the encapsulant. Moreover, in the present invention, the mechanical strength and supportability of the bonding wires can be improved. Thus the problems in the prior art can be solved by the present invention.

BRIEF DESCRIPTION OF THE DRAWINGS

The invention can be more fully understood by reading the following detailed description of the preferred embodiments with reference made to the accompanying drawings, wherein.

DETAILED DESCRIPTION OF THE PREFERRED EMBODIMENTS

Preferred embodiments of a semiconductor package and a method for fabricating the same proposed in the present invention are described in detail as follows with reference to FIGS. 3A to 3I and FIGS. 4A to 4D, wherein FIGS. 3A to 3I show a fabrication method of a substrate used in the semiconductor package.

Figure 3A:
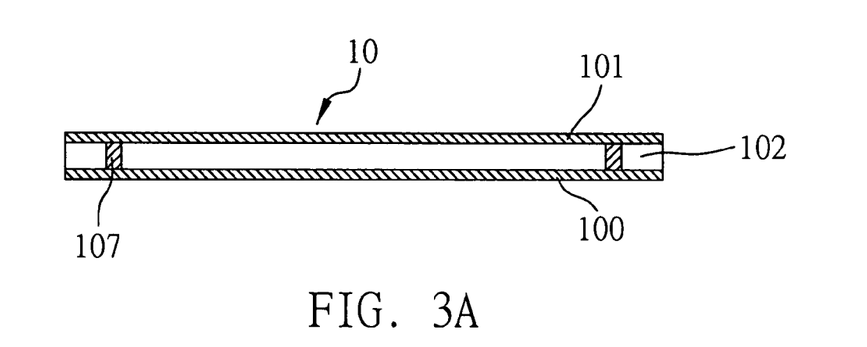
FIGS. 3A to 3I are schematic diagrams showing procedural steps of a method for fabricating a substrate used in a semiconductor package according to the present invention.
Figure 3B:
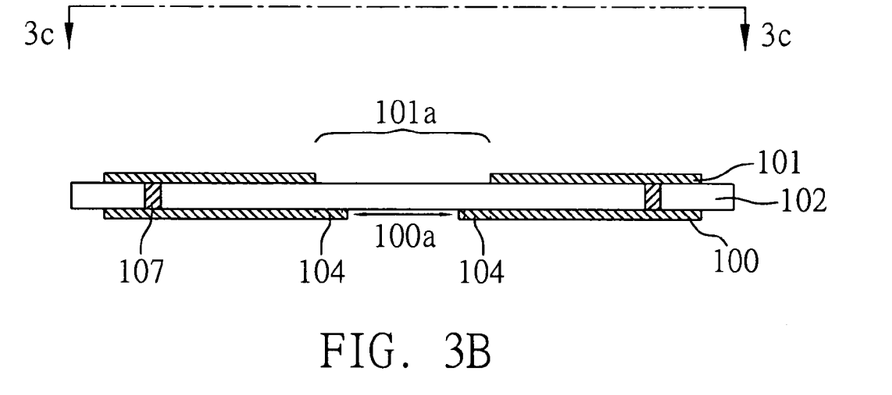
Figure 3C:
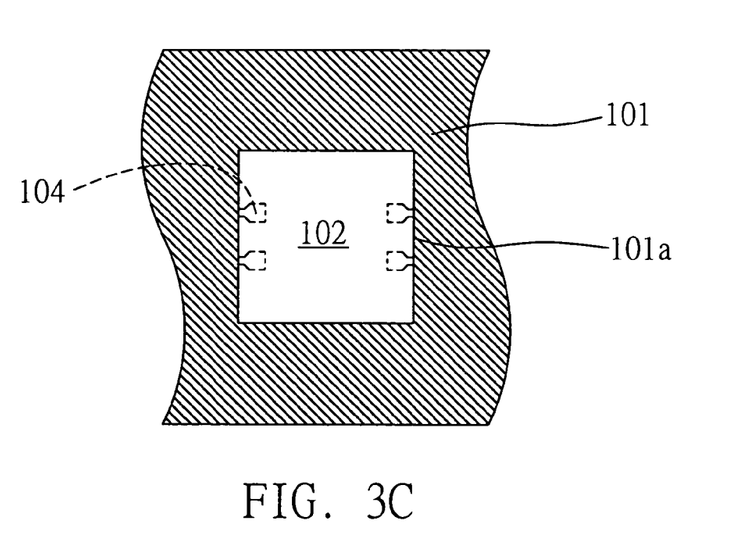

First, referring to FIG. 3A, a dual-layer substrate 10, such as a copper clad laminate (CCL) substrate, is prepared. This substrate 10 comprises a first copper circuit layer 100; a second copper circuit layer 101; an insulating core layer 102 formed between the first and second circuit layers 100, 101, making the first and second circuit layers 100, 101 separated by the core layer 102; and a plurality of conductive vias 107 formed in the core layer 102, for electrically connecting the first and second circuit layers 100, 101 to each other. Then, referring to FIG. 3B, the first and second circuit layers 100, 101 are subjected to a patterning process including exposure, development, etching, etc. to respectively form predetermined circuit patterns. As a result, the first circuit layer 100 is formed with a plurality of bond fingers 104 and a central first opening 100a. The second circuit layer 101 is formed with a central second opening 101a corresponding in position to the first opening 100a of the first circuit layer 100, wherein the first opening 100a is smaller than the second opening 101a, and predetermined portions of the core layer 102 are exposed via the first opening 100a the second opening 101a. As shown in FIGS. 3B and 3C (FIG. 3C is a top view of FIG. 3B), the first opening 100a is surrounded and defined by the plurality of bond fingers 104 of the first circuit layer 100, and the second opening 101a is surrounded and defined by conductive traces (not shown) of the second circuit layer 101.

Figure 3D:
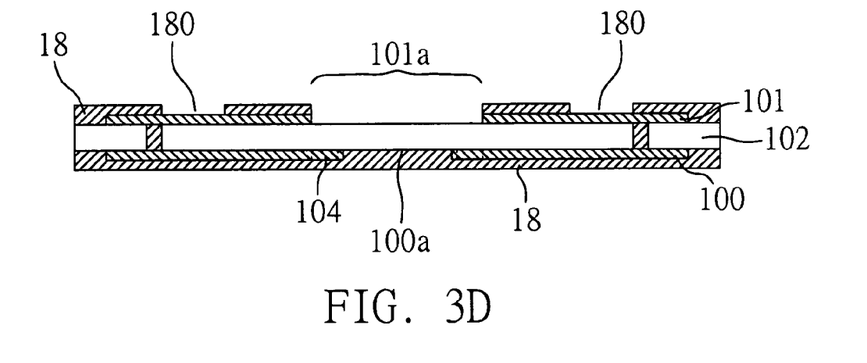

Subsequently, referring to FIG. 3D, a solder mask 18 is applied on the first circuit layer 100 and the second circuit layer 101 respectively to protect the circuit patterns thereof. A plurality of openings 180 are formed in the solder mask 18 covering the second circuit layer 101 to expose predetermined portions of the circuit patterns of the second circuit layer 101.

Figure 3E:
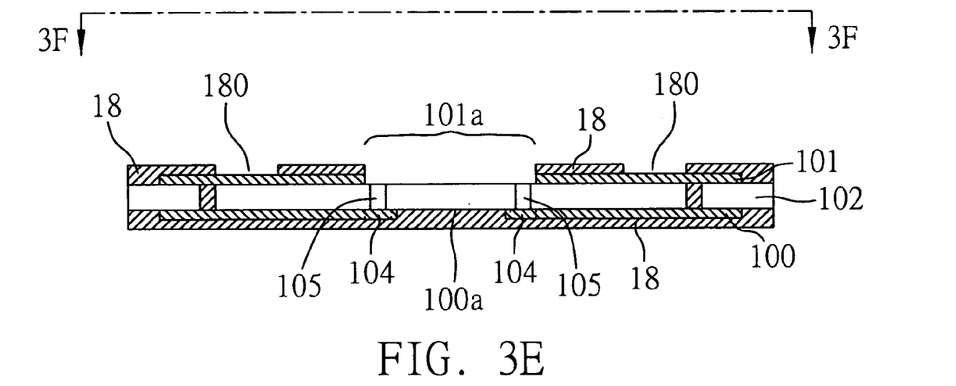
Figure 3F:
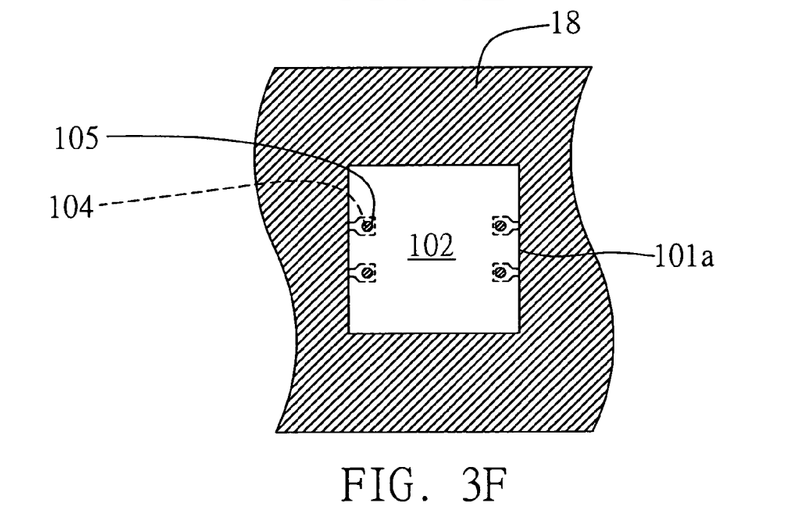

Referring to FIG. 3E, a laser drilling technique is adopted to drill a plurality of finger holes 105 on the portion of the core layer 102 exposed via the second opening 101a of the second circuit layer 101, and the finger holes 105 correspond in position to the plurality of bond fingers 104 of the first circuit layer 100. The finger holes 105 are made penetrating the core layer 102 such that the bond fingers 104 can be partially exposed via the finger holes 105. This process is accomplished by a material selectivity characteristic of laser to remove only the material of core layer 102 without damaging the material of bond fingers 104 by adjusting the energy of laser. As shown in FIG. 3F, which is a top view of FIG. 3E, areas with oblique lines in the finger holes 105 represent the portions of the bond fingers 104 exposed via the finger holes 105.

Figure 3G:
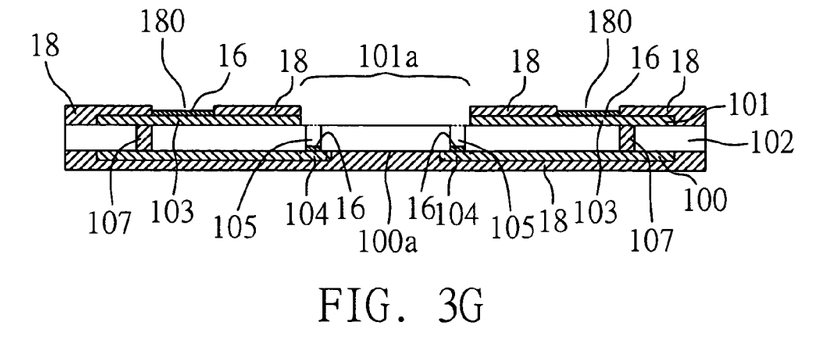
Figure 3H:
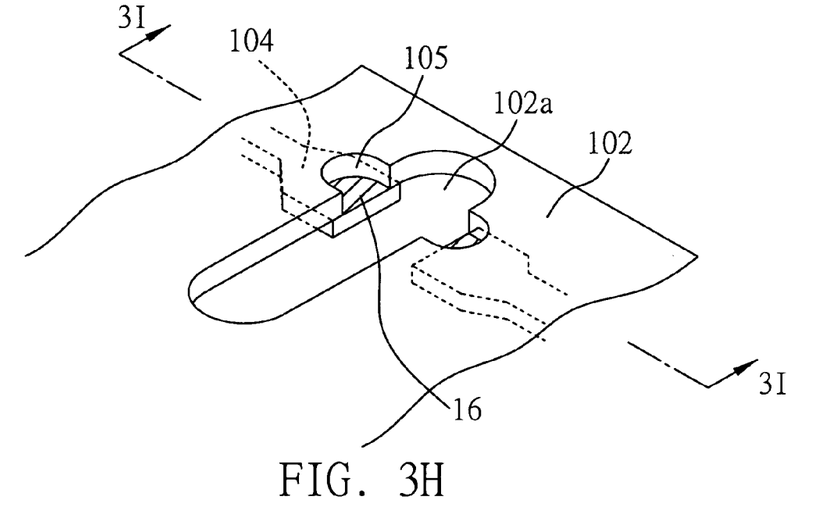
Figure 3I:
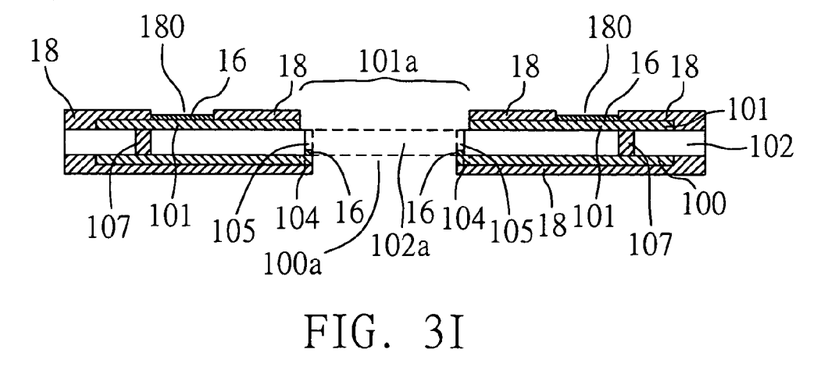

Referring to FIG. 3G, a plating process is performed to form a nickel(Ni)/gold(Au) layer 16 on the exposed portions of the bond fingers 104 and a copper layer 103 of the circuit patterns exposed from the openings 180 of the solder mask 18, so as to allow bonding wires and solder balls (not shown) to be subsequently bonded to the Ni/Au layer 16 that can enhance the bonding reliability. Referring to FIGS. 3H and 3I, a router is used to form a through opening 102a in the core layer 102, and the through opening 102a communicates with the second opening 101a of the second circuit layer 101 and the first opening 100a of the first circuit layer 100. As shown in FIG. 3H, the through opening 102a also communicates with the finger holes 105, such that the subsequently formed bonding wires can electrically connect a chip (not shown) to the bond fingers 104 through the first opening 100a, the through opening 102a and the finger holes 105 where the bond fingers 104 are exposed. This completes the fabrication of the substrate 10 in the present invention. FIG. 3I is a cross-sectional view of FIG. 3H taken along line 3I—3I through the finger holes 105, which allows the relative sizes and locations of the through opening 102a and finger holes 105 to be observed.

Accordingly, the above fabricated substrate 10 can be used to fabricate a semiconductor package according to the present invention by a method illustrated in FIGS. 4A to 4D. In FIGS. 4A to 4D, the substrate 10 is turned upside down, that is to allow the first circuit layer 100 to face upwards.

Figure 4A:
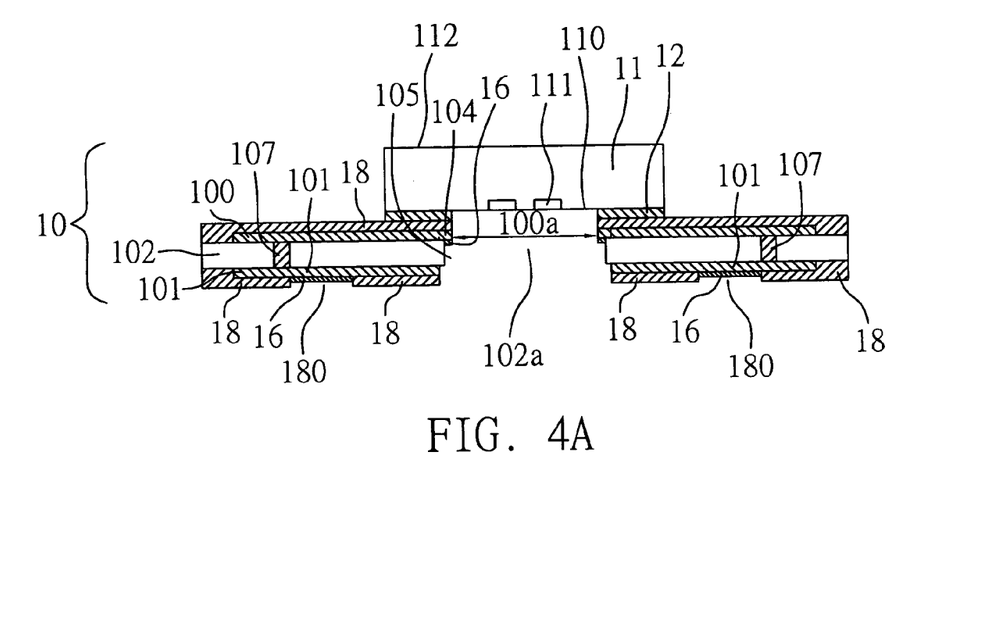
FIGS. 4A to 4D are schematic diagrams showing procedural steps of a method for fabricating the semiconductor package according to the present invention using the substrate shown in FIG. 3I.
Figure 4B:
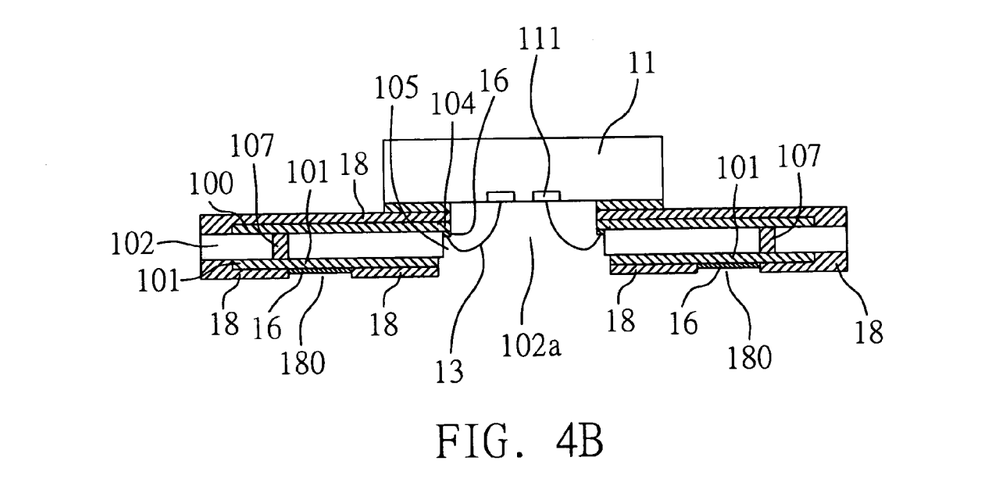
Figure 4C:
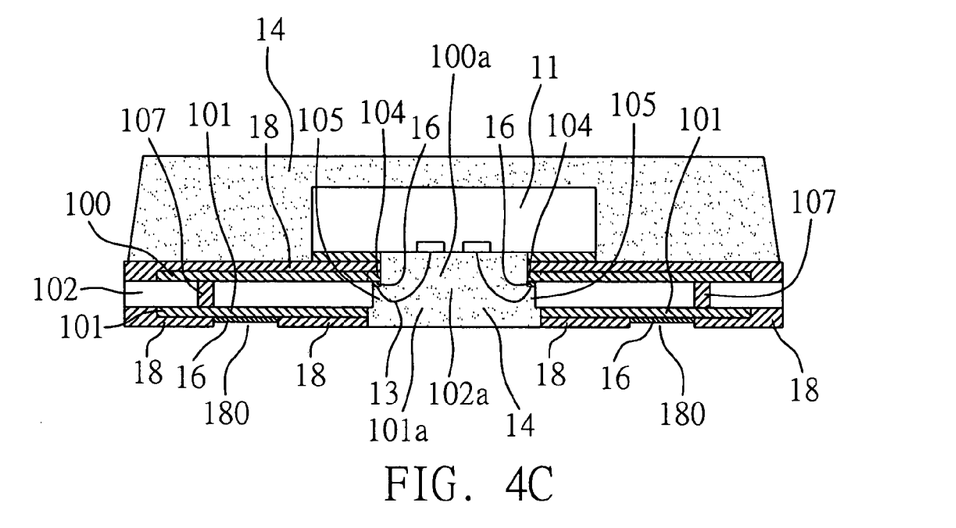

First, referring to FIG. 4A, an active surface 110 of a chip 11 is mounted via an adhesive 12 on the solder mask 18 covering the first circuit layer 100 of the substrate 10 in a manner that, the first opening 100a is covered by the chip 11, and bond pads 111 formed on the chip 11 are exposed to the first opening 100a. Then, referring to FIG. 4B, a wire-bonding process is performed to form a plurality bonding wires 13, such as gold wires, for electrically connecting the bond pads 111 of the chip 11 to the bond fingers 104 on the first circuit layer 100, wherein the bonding wires 13 are completely received in the through opening 102a of the substrate 10 and connected to the Ni/Au layer 16 plated respectively on the bond fingers 104 through the finger holes 105 where the bond fingers 104 are exposed (FIG. 3H); that is, the bonding wires 13 are inserted in the finger holes 105 to be connected to the bond fingers 104. The supportability of the bonding wires 13 is enhanced by the surrounding core layer 102, thereby improving the reliability and yield of the wire-bonding process. Referring to FIG. 4C, an encapsulant 14 is formed on the substrate 10 to encapsulate the chip 11 and the bonding wires 13 and fill the through opening 102a, the first and second opening 100a, 101a and the finger holes 105 of the substrate 10. Since the bonding wires 13 are completely received in the through opening 102a, the encapsulant 14 for encapsulating the bonding wires 13 does not protrude out of the substrate 10. In other words, the height of the encapsulant 14 filling the first and second openings 100a, 101a and the through opening 102a is equal to or smaller than the thickness of the substrate 10. This thus eliminates the prior-art problems of encapsulant flash and limitation on density of solder balls arranged on the substrate, and only requires a simple encapsulation mold, for example comprising an upper mold with a cavity and a flat lower mold, for fabricating the encapsulant 14 in the present invention. Finally, referring to FIG. 4D, a plurality of solder balls 15 are implanted at the Ni/Au layer 16 plated on the second circuit layer 101 of the substrate 10, and the overall structure is sawed to completely form the semiconductor package according to the present invention.

Figure 4D:
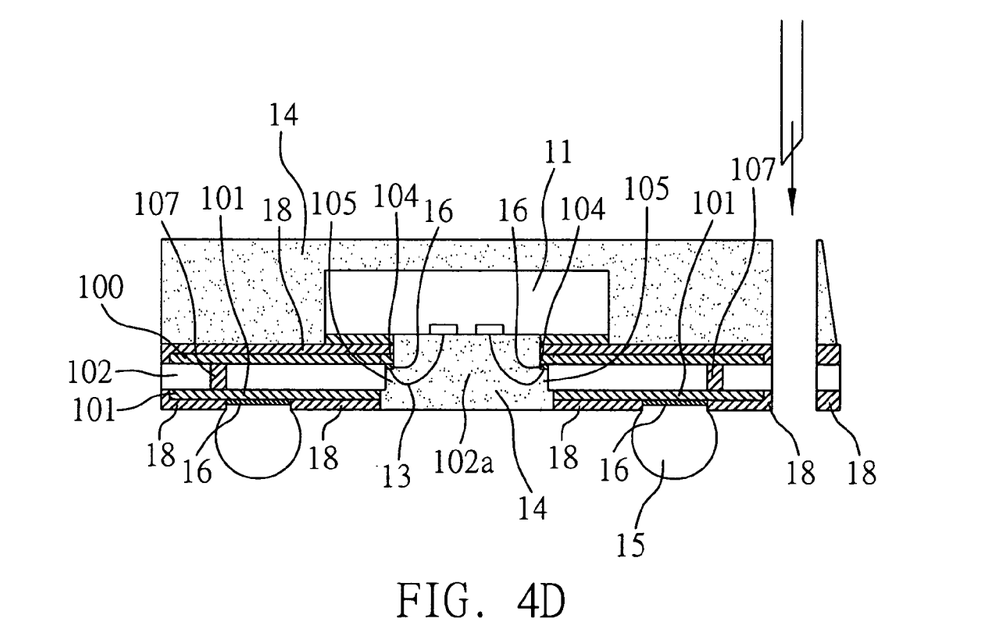

Therefore, the semiconductor package in the present invention is shown in FIG. 4D, comprising: a substrate 10, at least one chip 11, a plurality of bonding wires 13, an encapsulant 14, and a plurality of solder balls 15.

The substrate 10 comprises a first circuit layer 100, a second circuit layer 101, and a core layer 102 formed between the first circuit layer 100 and the second circuit layer 101. At least one first opening 100a is formed on the first circuit layer 100, and at least one second opening 101a is formed on the second circuit layer 101. A plurality of finger holes 105 are provided in the core layer 102 at positions corresponding to a plurality of bond fingers 104 formed on the first circuit layer 100. A through opening 102a is formed through the core layer 102 and communicates with the first opening 100a and the second opening 101a (FIG. 3I). The chip 11 is mounted via its active surface 110 on the first circuit layer 100 of the substrate 10 in a manner that, the chip 11 covers the first opening 100a, and a plurality of bond pads 111 formed on the chip 11 are exposed to the first opening 100a. The bonding wires 13 electrically connect the bond pads 111 of the chip 11 to the bond fingers 104 on the first circuit layer 100 through the finger holes 105. The solder balls 15 are implanted on the second circuit layer 101 of the substrate 10 and can be electrically connected to an external device such as a printed circuit board. The encapsulant 14 encapsulates the chip 11 and the bonding wires 13 and fills the through opening 102a, the first and second opening 100a, 101a and the finger holes 105.

In summary, the semiconductor package and the method for fabricating the same provided by the present invention allow the encapsulant not to protrude out of the substrate, such that the density of solder balls implanted on the substrate can be increased, and the prior-art problems of encapsulant flash and difficulty in standardizing the encapsulation mold are eliminated. Moreover, by provision of the finger holes with the surrounding core layer, the mechanical strength and supportability of the bonding wires can be enhanced strengthened, thereby improving the reliability and yield of the wire bonding process as well as the electrical performance of the semiconductor package.

The invention has been described using an exemplary preferred embodiment. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package, comprising:
   a substrate having a first circuit layer, a second circuit layer, and a core layer formed between the first circuit layer and the second circuit layer, wherein at least one second opening is formed on the second circuit layer and at least one first opening is formed on the first circuit layer at a position corresponding to the second opening, and wherein a plurality of finger holes are formed in the core layer at positions corresponding to a plurality of bond fingers formed on the first circuit layer, and a through opening is formed in the core layer and communicates with the first and second openings, wherein a Ni/Au layer is formed on the bond fingers respectively;

at least one chip mounted on the first circuit layer of the substrate to cover the first opening, allowing an active surface of the chip to be exposed to the first opening;

a plurality of bonding wires for electrically connecting the active surface of the chip to the plurality of bond fingers on the first circuit layer through the finger holes; and an encapsulant for filling the first and second openings and the through opening and encapsulating the chip and the bonding wires.

2. The semiconductor package of claim 1, wherein the plurality of bonding wires are inserted in the finger holes to be connected to the bond fingers.

3. The semiconductor package of claim 1, wherein the through opening in the core layer communicates with the finger holes.

4. The semiconductor package of claim 1, wherein the bonding wires are completely received in the through opening of the substrate.

5. The semiconductor package of claim 1, wherein the height of the encapsulant filling the first and second openings and the through opening is equal to or smaller than the thickness of the substrate.

6. The semiconductor package of claim 1, wherein the core layer is further formed with a plurality of conductive vias for electrically connecting the first and second circuit layers to each other.

7. The semiconductor package of claim 1, further comprising a plurality of solder balls implanted on the substrate.

* * * * *